United States Patent [19]

Streetman et al.

[11] Patent Number: 5,034,604
[45] Date of Patent: Jul. 23, 1991

[54] REFRACTORY EFFUSION CELL TO GENERATE A REPRODUCIBLE, UNIFORM AND ULTRA-PURE MOLECULAR BEAM OF ELEMENTAL MOLECULES, UTILIZING REDUCED THERMAL GRADIENT FILAMENT CONSTRUCTION

[75] Inventors: Ben G. Streetman, Austin; Terry J. Mattord, Red Rock, both of Tex.; Vijay P. Kesan, Croton-on-Hudson, N.Y.; Ben G. treetman, Austin; Terry Mattord, Red Rock, both of Tex.

[73] Assignee: Board of Regents, The University of Texas System, Austin, Tex.

[21] Appl. No.: 400,549

[22] Filed: Aug. 29, 1989

[51] Int. Cl.$^5$ .......................... H01S 1/00; C23C 14/26
[52] U.S. Cl. .................... 250/251; 392/388; 392/389
[58] Field of Search ................. 250/251, 423 R, 425; 392/388, 389

[56] References Cited

U.S. PATENT DOCUMENTS

| 2,330,135 | 4/1948 | Alexander | 219/275 |
|---|---|---|---|
| 2,793,609 | 5/1957 | Tzu en Shen et al. | 392/388 |
| 3,153,137 | 10/1964 | Drumheller | 219/271 |
| 3,662,154 | 5/1972 | Harra | 219/271 |
| 3,974,002 | 8/1976 | Casey, Jr. et al. | 148/175 |
| 4,137,865 | 2/1979 | Cho | 118/49.1 |
| 4,181,544 | 1/1980 | Cho | 148/175 |
| 4,239,955 | 12/1980 | Cho | 219/271 |
| 4,385,946 | 5/1983 | Finegan et al. | 250/492.2 |
| 4,392,453 | 7/1983 | Luscher | 118/726 |
| 4,426,569 | 1/1984 | Miller et al. | 219/271 |
| 4,518,846 | 5/1985 | Freeouf et al. | 219/271 |
| 4,543,467 | 9/1985 | Eisele et al. | 219/271 |
| 4,553,022 | 11/1985 | Colombo | 219/275 |
| 4,570,066 | 2/1986 | Schlag et al. | 250/251 |
| 4,607,152 | 8/1986 | Allovon et al. | 219/271 |
| 4,646,680 | 3/1987 | Maki | 118/726 |
| 4,648,347 | 3/1987 | Aichert et al. | 118/720 |
| 4,699,083 | 10/1987 | Huet et al. | 118/719 |
| 4,748,315 | 5/1988 | Takahashi et al. | 219/271 |
| 4,777,022 | 10/1988 | Boldish et al. | 422/245 |
| 4,789,779 | 12/1988 | Drullinger | 250/251 |

OTHER PUBLICATIONS

Calawa, "On the use of AsH$_3$ in the Molecular Beam Epitaxial Growth of GaAs", Appl. Phys. Lett., vol. 38, No. 9, pp. 701–703, (May 1, 1981).
EPI Systems' "Dual Filament Effusion Cells".
EPI System Borchure for Model 175 Cracking Effusion Cell Garcia, et al., "Dimer Arsenic Source Using a High Efficiency Catalytic Cracking Oven for Molecular Beam Epitaxy", Appl. Phys. Lett., vol. 51, No. 8, pp. 593–595, (Aug. 24, 1987).

Primary Examiner—Jack I. Berman
Assistant Examiner—Kiet T. Nguyen
Attorney, Agent, or Firm—Arnold, White & Durkee

[57] ABSTRACT

A device and method for producing an ultra pure molecular beam of elemental molecules utilizing a reduced thermal gradient filament construction in an effusion cell is provided. The effusion cell comprises a crucible having an open and a closed end and at least one heating filament distributed immediate the crucible. The at least one heating filament or filaments are provided having a first portion having a first pitch in proximal relationship to the open end of the crucible and having a second portion having a second pitch wherein the first pitch is of a higher spatial frequency than the second pitch. The heating filament is non-inductively wound about the crucible and positioned in conformity to the outside structure of the crucible. The heat shield is positioned proximate and about the crucible and heating filament or filaments. The heating filaments are connected to a controllable electric power supply producing a near constant temperature along the long axis of the crucible. By placing source material in the crucible and placing the crucible heating filaments and heat shield in a reduced pressure atmosphere and powering the heating filaments, a substantially constant temperature is produced along the crucible long axis resulting in an ultra pure molecular beam of elemental molecules of the source material.

66 Claims, 5 Drawing Sheets

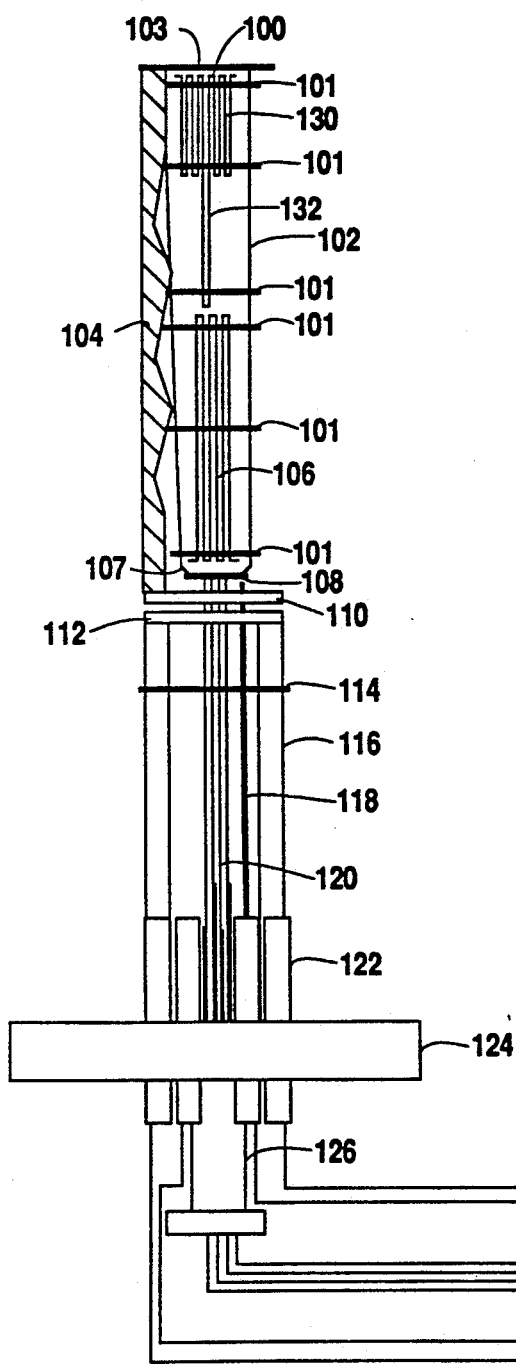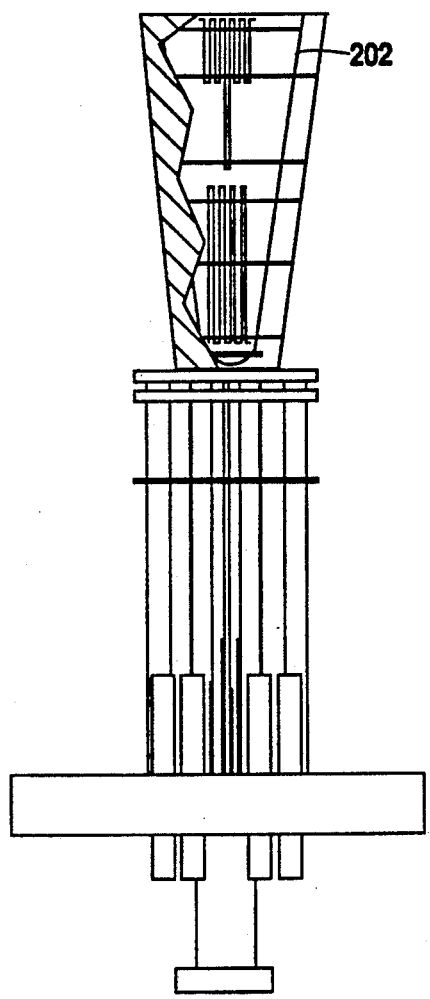
Fig. 2
Fig. 3

REFRACTORY EFFUSION CELL TO GENERATE A REPRODUCIBLE, UNIFORM AND ULTRA-PURE MOLECULAR BEAM OF ELEMENTAL MOLECULES, UTILIZING REDUCED THERMAL GRADIENT FILAMENT CONSTRUCTION

BACKGROUND OF THE INVENTION

1. Field of the Invention

This invention relates to a device and a method for generating a reproducible, uniform and ultra-pure molecular beam of elemental molecules, utilizing a refractory effusion cell. In particular, the invention relates to a filament construction able to produce a substantially constant temperature along the long axis of the crucible of an effusion cell and provide long-term flux stability.

2. Description of Related Art

Molecular beam epitaxy (MBE) is a crystal growth technique intended to allow precise control of beam fluxes and deposition conditions. For successful MBE growth, it is important to produce a stable, reproducible and uniform molecular beam of each elemental constituent of the thin film being deposited. This is accomplished, to some degree, through the use of Knudsen or effusion cells. Ideally, a Knudsen cell is an isothermal enclosure with an infinitesimally small exit aperture bounded by vanishingly thin walls. Knudsen-like cells are critical components in MBE systems and are the basis for substantial molecular beam generation.

Typically, MBE sources differ significantly from ideal Knudsen cells. Exit apertures are not bounded by vanishingly thin walls and large exit orifices are often employed to enhance growth rates. In conventional cell design, the solid or liquid source materials are held in an inert crucible heated by radiation from a resistive heat source. A thermocouple is used to provide temperature feedback. Conventional cells have significant radiated heat loss at the orifice, resulting in a temperature drop at or near the orifice and large thermal gradients along the long axis of the crucible. In certain situations, source material may condense at the opening of the crucible, reduce the exit orifice and redistribute the contents of the crucible. This causes a dramatic change in flux density for a given temperature set point. To maintain the same flux density over an extended period of time, a continuous increase in applied power to the cell must be maintained. Unfortunately, this may result in an increase in the generation of active gases such as nitrogen and carbon monoxide. A reduction in the cell's exit orifice dimensions may also decrease the uniformity of film growth.

Conventional cell design can allow certain source materials, such as gallium, to condense at the orifice and form droplets which roll back into the heated source material producing microdroplets of source material spitting from the thermodynamic reaction. Such spitting may land on the substrate and cause a defect.

SUMMARY OF THE INVENTION

The device of the present invention for generating a reproducible and uniform beam of elemental molecules largely solves the problems associated with a large thermal gradient along the long axis of the crucible. In particular, the present invention largely solves the problem of condensation of source material at the crucible opening reducing the exit orifice and redistributing the contents of the crucible. The present invention also largely solves the problem of droplet formation at the crucible orifice which may roll back into the heated source material.

The device of the present invention includes a crucible preferably having an open end and a closed end able to hold source material and at least one heating filament distributed immediate the crucible wherein the heating filament or filaments have a first portion with a first pitch in proximal relationship to the crucible's open end, and a second portion with a second pitch in distal relationship to the crucible's open end, the first pitch being of a higher spatial frequency than the second pitch. This creates at least one heating filament distributed immediate the crucible to produce a substantially constant temperature along the long axis of the crucible.

A first alternate embodiment includes a crucible preferably having an open end and a closed end able to hold source material, a heating filament distributed immediate the crucible wherein the filament has a plurality of pitches including a first pitch in proximal relationship to the crucible's open end, the first pitch being of a higher spatial frequency than other pitches of the plurality of pitches.

A second alternate embodiment includes a crucible preferably having an open end and a closed end able to hold source material, a first heating filament distributed immediate the crucible in proximal relationship to the crucible's open end, and having a first pitch, and a second heating filament distributed immediate the crucible in distal relationship to the open end and having a second pitch, wherein the first pitch is of a higher spatial frequency than the second pitch.

The crucible of the described embodiments of the present invention preferably comprising pyrolytic boron nitride, aluminum nitride, or other materials, such materials preferably being inert, being substantially transparent to infrared energy and thereby neither significantly conducting nor diffusing heat and being mechanically strong and able to withstand high thermal stresses.

In the described embodiments, the heating filament or filaments are positioned in a non-inductively wound path, typically serpentine, lengthwise about the crucible. Additionally the heating filament or filaments are positioned in conformity to the outside structure of the crucible and the heating filament or filaments comprise a resistive material, such as high purity tantalum, tungsten, rhenium, alloys thereof, or other materials having electrical resistivity to allow use of the material as a heating filament. The heating filament or filaments also are preferably ductile to allow positioning the filament about the crucible, are preferably in the form of wire or foil and are preferably inert.

In the described embodiments, a heat shield is preferably positioned proximate and about the crucible and the heating filament or filaments. The heat shield preferably comprises multiple thermally isolated concentric foil wraps. The foil wraps preferably comprise tantalum or other inert, ductile materials where each such material is preferably weldable to itself. The wraps are thermally isolated from each other preferably through the placement of metal strips attached at one end of the outer diameter of the concentric foil wraps thus spacing each wrap from each adjacent wrap. The metal strips comprise expanded tantalum. The heat shield is positionable in conformity to the outside structure of the crucible and to the positioning of the heating filament or filaments.

The heating filament or filaments are electrically connectable to at least one controllable electric power supply. For example, in the second alternate embodiment, preferably a first controllable electric power supply is connectable to the first heating filament and a second controllable electric power supply is connectable to the second heating filament.

In the described embodiments, temperature control is accomplished through the use of a temperature sensing assembly, such as a dual thermocouple assembly, positioned in intimate proximity to the closed end of the crucible. The temperature sensing assembly is electrically connectable to at least one controllable electric power supply which in turn is connectable to at least one heating filament.

The heating filament or filaments are supported by a filament support, preferably in the form of a disk, positionable about the crucible. The filament support disk comprises passages through which the heating filament or filaments traverse. For example, in the second alternate embodiment, preferably the filament support disk comprises a first and a second set of passages and the first heating filament traverses the filament support disk through the first set of passages and the second heating filament traverses the filament support disk through the second set of passages. In the described embodiments, the filament support disk preferably comprises pyrolytic boron nitride, aluminum nitride, or other inert materials where the materials are preferably substantially transparent to infrared energy and thereby neither significantly conduct nor diffuse heat, are mechanically strong, and are able to withstand high thermal stresses.

The support structure of the effusion cell is thermally isolated from the crucible and heating filament or filaments. The support structure preferably comprises a support base, support rods attached perpendicular to the support base, a heat shield base, preferably in the form of a disk, attached to the support rods in parallel and spaced relationship to the support base, and a support cup attached to and thermally isolated from the heat shield disk. The heat shield is then attached to the support cup and the heat shield supports the filament support disk which in turn supports the crucible. In the support structure, the support rods preferably comprise molybdenum or other inert, mechanically strong materials, and the heat shield base preferably comprises tantalum or other inert materials where each such material is preferably weldable to the heat shield. In use, the crucible and heating filament or filaments are enclosed in an ultra high vacuum chamber preferably of the type used in conventional molecular beam epitaxy systems.

The method of the present invention for producing a molecular beam comprises the steps of placing a source material in a crucible where the crucible has an open end and a closed end, distributing at least one heating filament immediate the crucible wherein the at least one heating filament has a first portion with a first pitch in proximal relationship to the crucible's open end and the at least one heating filament has a second portion with a second pitch in distal relationship to the crucible's open end and the first pitch is of a higher frequency than the second pitch, placing the source material, the crucible and the at least one heating filament in a reduced pressure atmosphere, and applying electrical power to the at least one heating filament producing a substantially constant temperature along the long axis of the crucible and generating a flux of the source material.

In a first alternate embodiment of the method of the present invention, the step of distributing at least one heating filament includes distributing a heating filament immediate the crucible wherein the heating filament has a plurality of pitches and the plurality of pitches comprise a first pitch in proximal relationship to the open end of the crucible and the first pitch has a higher frequency than other pitches of the plurality of pitches.

In a second alternate embodiment of the method of the present invention, the step of distributing at least one heating filament comprises distributing a first heating filament immediate the crucible in proximal relationship to the open end of the crucible and having a first pitch, and distributing a second heating filament immediate the crucible in distal relationship to the open end of the crucible and having a second pitch wherein the first pitch has a higher frequency than the second pitch.

The described preferred embodiments of the method of the present invention further include the step of controlling the temperature of the crucible. The step of controlling the temperature of the crucible comprises the step of electrically connecting at least one controllable electric power supply to the at least one heating filament. Alternatively, the step of controlling the temperature of the crucible comprises the step of positioning a temperature sensor in intimate proximity to the closed end of the crucible and electrically connecting the temperature sensor to at least one controllable electric power supply. For example, in the method of the second alternate embodiment, the step of controlling the temperature of the crucible comprises the step of electrically connecting the controllable electric power supply to the first heating filament and connecting the same or an alternate controllable electric power supply to the second heating filament. The temperature sensor may be connected to the first power supply and, additionally, to the second power supply.

In the described preferred embodiments of the method of the present invention, the additional step of placing a heat shield about the crucible and about the heating filament or filaments is preferably included. In the second alternate embodiment of the method of the present invention, for example, the heat shield is placed about the crucible and the first and second heating filaments.

The described embodiments of the method of the present invention preferably further include the step of supporting the crucible, the heating filament or filaments and the heat shield through a support structure thermally isolated from the crucible, the heating filament and the heat shield.

In the described embodiments of the method of the present invention, the heating filament or filaments are positioned non-inductively about the crucible.

The present invention allows for a minimal thermal gradient along the crucible long axis thus reducing problems associated with cooling of the source material near the crucible opening.

BRIEF DESCRIPTION OF THE DRAWINGS

FIG. 2 is a cross-section of a second preferred embodiment of an effusion cell in accordance with the present invention;

FIG. 3 is a cross-section of a third preferred embodiment of an effusion cell in accordance with the present invention;

DETAILED DESCRIPTION OF THE PREFERRED EMBODIMENTS

First Preferred Embodiment

Figures 1A, 1B, 1C:
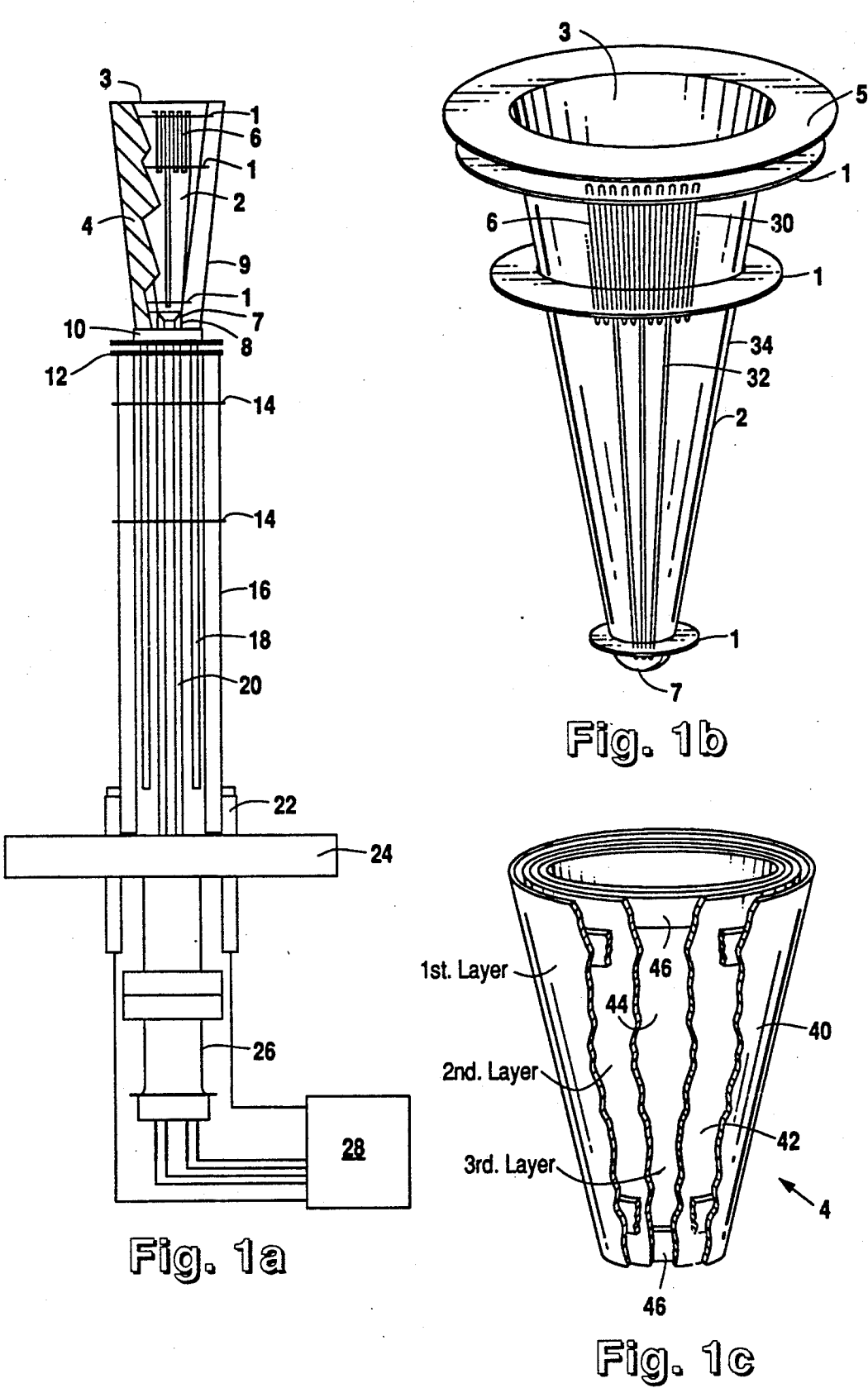
FIG. 1a is a cross-section of an effusion cell in accordance with the present invention.
FIG. 1b is an enlarged perspective view of a crucible and filament in accordance with the present invention.
FIG. 1c is an enlarged perspective view of a heat shield in accordance with the present invention.

FIGS. 1a, 1b and 1c illustrate a first preferred embodiment of an effusion cell in accordance with the present invention. Crucible 2 includes crucible open end 3 positioned at one end of crucible 2 and crucible closed end 7 positioned at the end of crucible 2 opposite open end 3 along the crucible long axis. Source material, including but not limited to aluminum and gallium, may be placed in crucible 2 through open end 3. Filament 6 is an electrically resistive material including but not limited to high purity tantalum wire or foil, which generates heat when connected to a source of electric power. Filament 6 is positioned immediate and about crucible 2. Filament 6 is preferably slightly spaced from crucible 2 by filament support disks 1. Filament 6 is positioned non-inductively about crucible 2 in a serpentine path. The path of filament 6 is increasingly concentrated approaching open end 3 along the crucible long axis.

Figure 6:
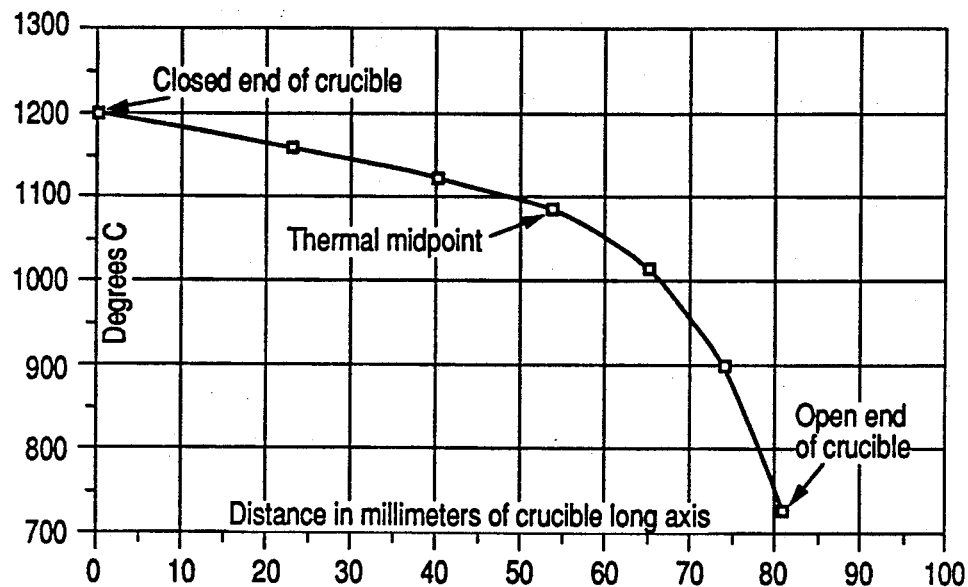
FIG. 6 is a graph of distance from a closed end of a crucible versus temperature in a conventional effusion cell.

For the 16 cubic centimeter capacity crucible shown in FIG. 1 having the thermal gradient shown in FIG. 6, filament 6 is non-inductively wound from crucible open end 3 to thermal midpoint 34 of crucible 2, back to open end 3, to thermal midpoint 34, back to open end 3 and finally approaching closed end 7. Eleven of these cycles exist in the completed filament in the first preferred embodiment. This winding creates a first pitch 30 of filament 6 in proximal relationship to open end 3 and a second pitch 32 in distal relationship to open end 3 and first pitch 30 is of a higher frequency than second pitch 32. In particular, second pitch 32 is positioned closer to closed end 7 than is first pitch 30 when measured along the long axis of crucible 2. One skilled in the art will recognize that this pattern may be varied and that the pitches may be varied as a function of, among other factors, crucible shape, crucible volume, crucible length, size of the crucible open end, crucible material and filament material. The pitch and position of the filament or filaments, therefore depend on, among other factors, the choice of crucible and heat shield. The filament path and pitches are selected to produce a substantially constant temperature along the long axis of the crucible.

The concentration of filament 6 proximal crucible open end 3 of higher spatial frequency first pitch 30 offsets the higher heat loss associated with open end 3 as compared to the heat loss associated with closed end 7.

FIG. 6 is a graph illustrating how to determine the thermal midpoint of a given crucible. Because the thermal midpoint will vary by size, shape and material of crucible, the thermal midpoint must be determined individually for each different size, shape and material of crucible. To determine the thermal midpoint for a given crucible, the crucible is placed in a conventional effusion cell, that is, an effusion cell with a heating filament positioned uniformly about the crucible. FIG. 6 graphs the temperature gradient along the long axis of a crucible in such a conventional effusion cell. Temperature is measured by placing a temperature sensor inside the crucible and positioning it at various points along the long axis of the crucible and measuring the temperature at each of the various points. The temperature sensor does not directly contact the inside surface of the crucible during measurement. The thermal midpoint is defined as that point along the temperature gradient curve at which the curve begins to knee. For the crucible illustrated by the curve of FIG. 6, the thermal midpoint appears at approximately 53 millimeters from the closed end of the crucible measured along the crucible long axis. Therefore, although the position of the thermal midpoint for a given crucible will vary depending on, among other factors, crucible size, shape and material, individual crucibles may be substituted for identical replacement crucibles without redetermining the thermal midpoint.

Figure 7:
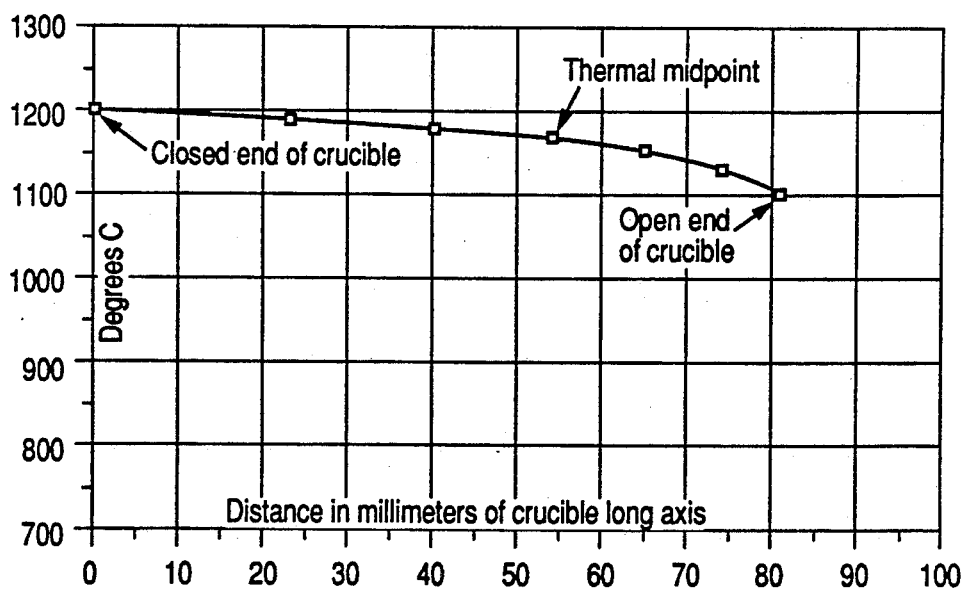
FIG. 7 is a graph of distance from a closed end of a crucible versus temperature in an effusion cell of the present invention.

FIG. 7 graphs the temperature gradient along the long axis of the crucible of FIG. 6 when the crucible is placed in the effusion cell of the first preferred embodiment. FIG. 7 illustrates a substantially constant temperature resulting along the long axis of the crucible. Preferably, a thermal gradient along the crucible long axis should not exceed about 15%.

Because variously sized and shaped crucibles are commonly in use in effusion cells, the thermal midpoint should be determined individually for each different size, shape and material of crucible. The thermal midpoint is useful in determining the pitches of the filament or filaments for a given crucible. FIGS. 1a, 1b and 6 illustrate a particular 16 cubic centimeter capacity crucible.

The plurality of filament pitches of the present invention, as shown by first pitch 30 and second pitch 32 in the first preferred embodiment, reduce the thermal gradient along the crucible's long axis. This largely solves the problem of condensation of source material and droplet formation at open end 3.

In the first preferred embodiment, filament 6 is constructed of 0.020 inch diameter unannealed high purity tantalum wire. One skilled in the art will recognize that other materials, including but not limited to expanded metal tantalum, tungsten, rhenium and alloys thereof, and other forms of materials, including but not limited to foil, may also be used as filament.

Filament 6 is supported by perforated filament support disks 1 through which filament 6 passes and in which crucible 2 may be positioned. By passing filament 6 through passages in support disks 1, support disks 1 support filament 6. In the first preferred embodiment, crucible support disks 1 and crucible 2 comprise pyrolytic boron nitride. As one skilled in the art will recognize, other materials suitable for a high heat, ultra high vacuum environment may also be used.

Thermocouple assembly 8 is a dual thermocouple in the preferred embodiment. Thermocouple assembly 8 is positioned near or in contact with closed end of crucible 7 and senses the temperature of closed end of crucible 7. Thermocouple assembly 8 is electrically connected through thermocouple leads 20 to controllable electric power supply 28. Controllable electric power supply 28 is further connected to both a power source and to filament 6. Controllable electric power supply 28 may then send electrical power to filament 6 based on the signal received from thermocouple assembly 8. Controllable electric power supply 28 may be set to a desired crucible temperature and regulate the electric power to filament 6 to maintain the desired temperature for crucible 2.

Heat shield 4 is positioned around filament 6 and crucible 2. Heat shield 4 minimizes power loss due to radiation from the filament. In the preferred embodiment, heat shield 8 comprises seven thermally isolated 0.002 inch thick tantalum foil wraps. Heat shield 4 is formed to conform with the outside structure of crucible 2 and heating filament 6. For clarity, only first layer foil wrap 40, second layer foil wrap 42 and third layer foil wrap 44 are shown in FIGURE 1c. Thermal isolation between foil wraps is accomplished in the first preferred embodiment by welding strips of expanded tantalum metal 46 onto both ends of the outer diameter of each concentric foil wrap. Each subsequent foil wrap is then isolated from the preceding foil wrap by the space created from the thickness of expanded metal strip 46.

Filament 6 and filament support disks 1 fit closely within heat shield 4. Crucible 2 may be placed and held within the inside diameters of support disks 1. Crucible 2 may be further held in position by wire retainers 9 extending from heat shield support cup 10 to crucible lip 5 at open end 3.

As shown in FIGURE 1a, crucible 2, filament 6 and support disks 1 are supported by a thermally isolated support structure. The support structure in the first preferred embodiment comprises heat shield 4 attached to heat shield support cup 10. Heat shield disk 12 is attached to and thermally isolated from heat shield support cup 10. Heat shield disk 12 is attached to support rods 16. Support rods 16 are positioned perpendicular to both heat shield disk 12 and flange 24. Flange 24 serves as a base of the support structure. Insulators 14 increase the stability of the support structure.

Flange 24 further includes both electric feedthroughs 22 and thermocouple feedthrough 26. Electric feedthroughs 22 allow connections to electrical bus 18 to be established through flange 24. Electrical bus 18 is, in turn, connected to filament 6. Thermocouple feedthrough 26 allows connection to thermocouple leads 20 through flange 24.

In this preferred embodiment, heat shield support cup 10 comprises molybdenum, heat shield disks 12 comprise tantalum, insulators 14 comprise pyrolytic boron nitride, electrical buses 18 comprise tantalum, crucible 2 comprises pyrolytic boron nitride and support rods 16 comprise molybdenum. One skilled in the art will recognize that other materials suitable for a high temperature, ultra high vacuum environment may also be used. Preferably, materials chosen will avoid contamination of the high temperature, ultra high vacuum environment.

Use of the term "inert" throughout this application refers to materials, compositions or chemicals that do not chemically react with the other materials, compositions, or chemicals that the inert materials, compositions, or chemicals may encounter in the device or method of the present application.

Second Preferred Embodiment

FIGS. 2 and 3 illustrate a two filament heat source in an effusion cell in accordance with the present invention. FIG. 2 illustrates cylindrical crucible 102.

Crucible 102 includes crucible open end 103 positioned at one end of crucible 102 and crucible closed end 107 positioned at the end of crucible 102 opposite open end 103 along the crucible long axis. Source material may be placed in crucible 102. First filament 100 and second filament 106 are positioned about crucible 102 to produce a non-inductive winding in the form of a serpentine path about crucible 102.

First filament 100 is shown having a first pitch 130 positioned in proximal relationship to crucible open end 103. First filament 100 is also shown having a second pitch 132 positioned intermediate first pitch 130 of first filament 100 and second filament 106 along the long axis of crucible 102. First pitch 130 is a higher frequency pitch than second pitch 132. Second filament 106 comprises a lower frequency pitch than first pitch 130.

First filament 100 and second filament 106 are positioned to provide a near constant temperature along the long axis of crucible 102. Filaments 100 and 106 are positioned immediate crucible 2. Filaments 100 and 106 are slightly spaced from crucible 102 by filament support disks 101.

In the second preferred embodiment, filaments 100 and 106 are supported by perforated support disks 101 through which filaments 100 and 106 pass and in which crucible 102 may be positioned.

Thermocouple assembly 108 is a dual thermocouple in the second preferred embodiment. Thermocouple assembly 108 is positioned near or in contact with crucible closed end 107 and thermocouple assembly 108 senses the temperature of crucible closed end 107. Thermocouple assembly 108 is electrically connected to controllable electric power supply 128 through thermocouple leads 120. Controllable electric power supply 128 is further connected to both a power source and to first filament 100. Controllable electric power supply 128 may then send electrical power to first filament 100 based on the signal received from thermocouple assembly 108. Controllable electric power supply 128 may further be connected to second filament 106 and may send electrical power to second filament 106 based on the signal received from thermocouple assembly 108. Controllable electric power supply 128 may be set to a desired crucible temperature and is able to regulate the crucible temperature by selectively powering first filament 100 and second filament 106.

Heat shield 104 is positioned around first filament 100, second filament 106 and crucible 102. Heat shield 104 is constructed in conformity with first filament 100, second filament 106 and the outside structure of crucible 102.

Crucible 102, filaments 100 and 106 and support disks 101 are supported by a thermally isolated support structure. The support structure in the second preferred embodiment includes heat shield 104 attached to heat shield support cup 110. Heat shield disk 112 is attached to and thermally isolated from heat shield support cup 110. Heat shield disk 112 is attached to support rods 116. Support rods 116 are positioned perpendicular to both heat shield disk 112 and flange 124. Flange 124 serves as a support base to the support structure. Insulator 114 increases the stability of the support structure.

Flange 124 further includes both electric feedthroughs 122 and thermocouple feedthrough 126. Electric feedthroughs 122 allow electrical connection to electrical bus 118 to be established through flange 124. Electric feedthroughs 122 connect via electrical bus 118 to first filament 100 and second filament 106. Thermocouple feedthrough 126 allows connection to thermocouple leads 120 to be established through flange 124.

Filaments, 100, 106 and filament support disks 101 fit within heat shield 104. In use, crucible 102 is placed and held within the inside diameters of support disks 101.

In the second preferred embodiment, heat shield support cup 110 comprises molybdenum, heat shield disk 112 comprises tantalum, insulator 114 comprises pyrolytic boron nitride, electrical bus 118 comprises tantalum, crucible 102 comprises pyrolytic boron nitride and support rods 116 comprise molybdenum.

FIG. 3 shows the second preferred embodiment of the present invention implemented on conical crucible 202.

One skilled in the art will recognize that other materials suitable for a high temperature, ultra high vacuum environment may also be used. Preferably, materials chosen will avoid contamination of the high temperature, ultra high vacuum environment.

Third Preferred Embodiment

Figure 4:
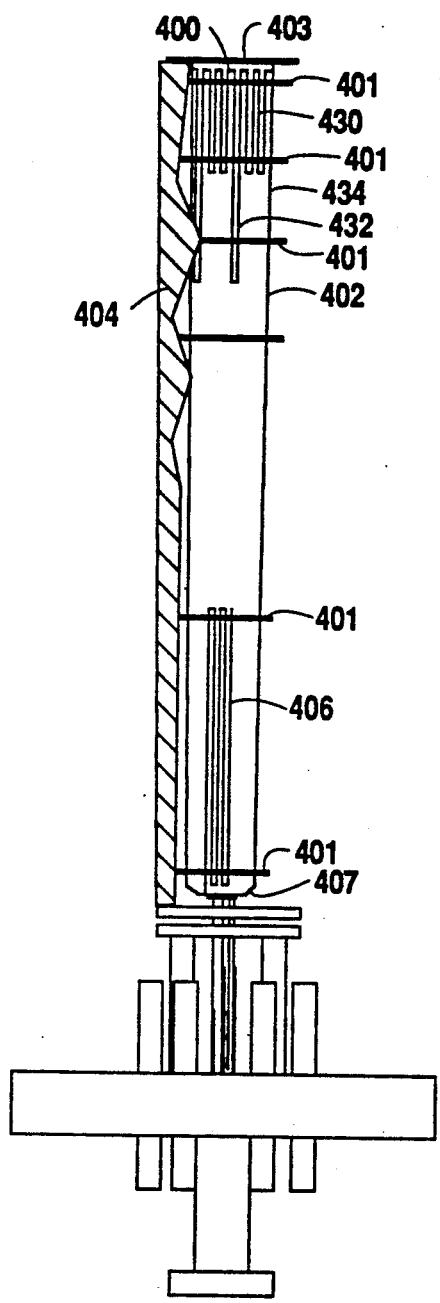
FIG. 4 is a cross-section of a fourth preferred embodiment of an effusion cell in accordance with the present invention.

FIG. 4 shows a third preferred embodiment of the present invention. First filament 400 is positioned immediate crucible 402 and is positioned proximal open end 403. First filament 400 comprises first pitch 430 and second pitch 432 wherein first pitch 430 is of a higher frequency than second pitch 432. Second pitch 432 is positioned distal from open end 403. Second filament 406 is positioned distal from open end 403 and is positioned further from open end 403 than first filament 400.

First filament 400 and second filament 406 are supported by filament support disks 401. Heat shield 404 is positioned proximate and about crucible 402 and in conformity to the contour of crucible 402, first filament 400 and second filament 406.

In the third preferred embodiment, heat shield 404 preferably is positioned about crucible 402 from open end 403 on the long axis of crucible 402 to closed end 407.

As in all preferred embodiments, the filaments are connectable to a controllable electric power supply which in combination with the filament distribution about the crucible, is able to maintain a near constant temperature along the crucible long axis.

Fourth Preferred Embodiment

Figure 5:
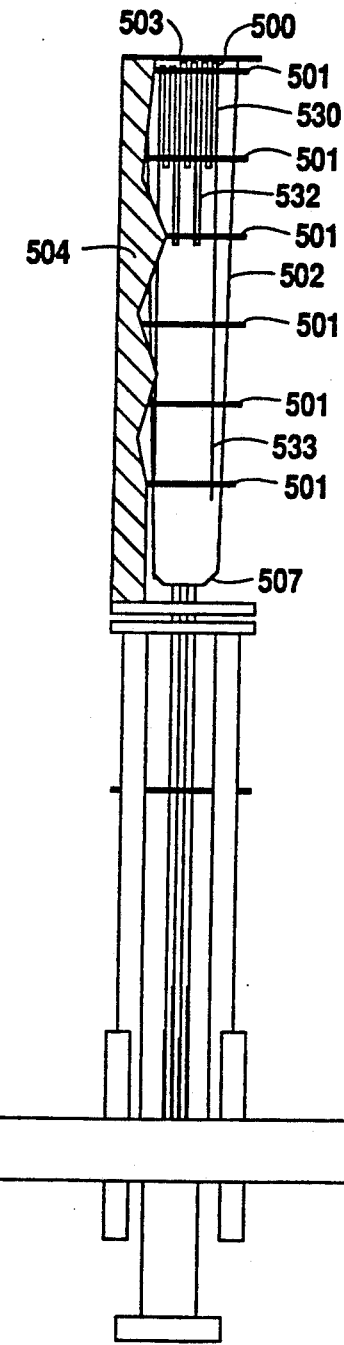
FIG. 5 is a cross-section of a fifth preferred embodiment of an effusion cell in accordance with the present invention.

FIG. 5 shows a fourth preferred embodiment of the present invention. Filament 500 is positioned immediate crucible 502 and is positioned proximal open end 503. Filament 500 comprises first pitch 530, second pitch 532 and third pitch 533 wherein first pitch 530 is of a higher frequency than second pitch 532 or third pitch 533. Second pitch 532 and third pitch 533 are positioned distal from open end 503.

Filament 500 is supported by filament support disks 501. Heat shield 504 is positioned proximate and about crucible 502 and in conformity to crucible 502 and filament 500.

In the fourth preferred embodiment, heat shield 504 preferably is positioned about crucible 502 from open end 503 on the long axis of crucible 502 to closed end 507.

As in all preferred embodiments, the filament is connectable to a controllable electric power supply which in combination with the filament distribution about the crucible, is able to maintain a near constant temperature along the crucible long axis.

Fifth Preferred Embodiment

Figure 8:
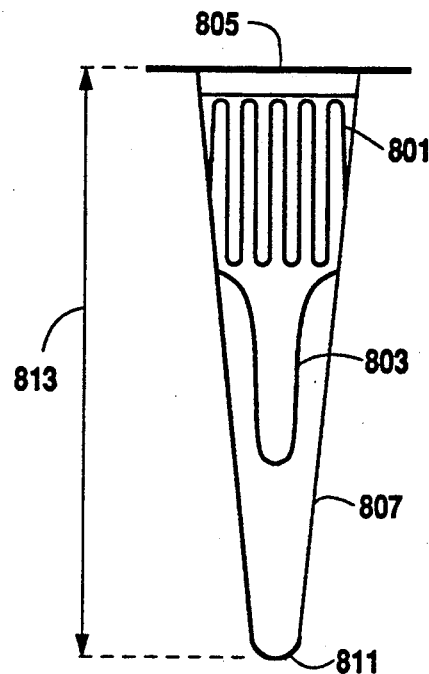
FIG. 8 is a crucible and filament configuration of a fifth preferred embodiment of an effusion cell of the present invention.

FIG. 8 shows the position of filaments 801 and 803 in a fifth preferred embodiment of the present invention. Filament 801 is positioned about crucible 807 and extends from approximately open end 805 along approximately one third the length of crucible long axis 813 toward closed end 811. Filament 803 is also positioned about crucible 807, but extends from a position along axis 813 beginning approximately one third the length of axis 813 from open end 805 to a position approximately two-thirds the length of axis 813 from open end 805.

Filament 801 has a pitch and comprises material which, when powered, produces approximately 80% of the heat applied to crucible 807. Filament 803 has a pitch and comprises material which, when powered, produces approximately 20% of the heat applied to crucible 807.

FIG. 8 shows crucible 807 having open end 805 of a diameter preferably less than or equal to about 0.8 inches and a length of axis 813 preferably in the range of about 3 to 4 inches.

As in all preferred embodiments, crucible 807 and filaments 801 and 803 are preferably positioned within a heat shield of the present invention.

Sixth Preferred Embodiment

Figure 9:
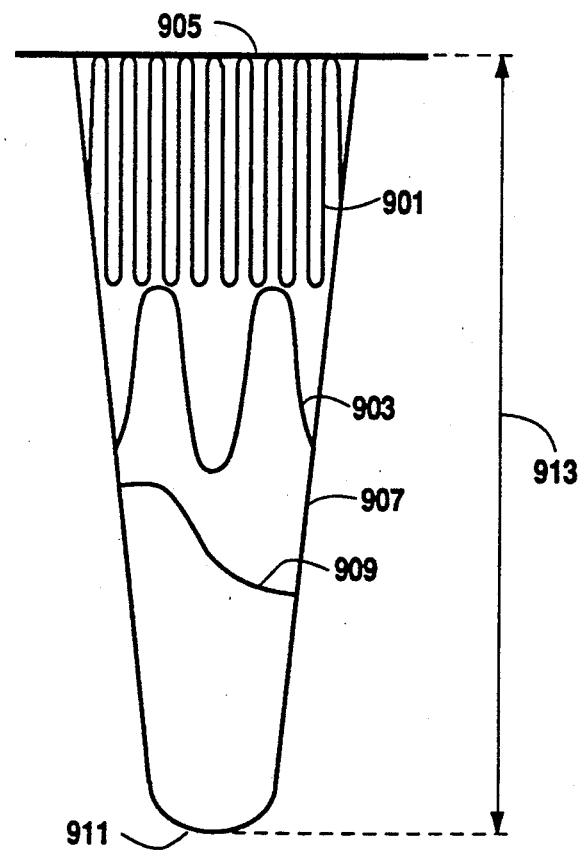
FIG. 9 is a crucible and filament configuration of a sixth preferred embodiment of an effusion cell of the present invention.

FIG. 9 shows the position of filaments 901, 903 and 909 in a sixth preferred embodiment of the present invention. Filaments 901, 903 and 909 are each positioned about crucible 907. Filament 901 extends from approximately open end 905 along approximately 30% of the length of crucible long axis 913 toward closed end 911. Filament 903 extends from a position along axis 913 beginning approximately 30% of the length of axis 913 from open end 905 to a position approximately 55% of the length of axis 913 from open end 905. Filament 909 extends from a position along axis 913 beginning approximately 55% of the length of axis 913 from open end 905 to a position approximately 70% of the length of axis 913 from open end 905.

Filament 901 has a pitch and comprises material, which when powered, produces approximately 80% of the heat applied to crucible 807. Filament 903 has a pitch and comprises material which, when powered, produces approximately 15% of the heat applied to crucible 807. Filament 909 has a pitch and comprises material which, when powered, produces approximately 5% of the heat applied to crucible 907.

FIG. 9 shows crucible 907 having open end 905 of a diameter preferably greater than about 0.8 inches and a length of long axis 913 preferably in the range of about 4 to 6 inches.

As in all preferred embodiments, crucible 907 and filaments 901, 903 and 909 are preferably positioned within a heat shield of the present invention.

Features and Operation of the Preferred Embodiments

In the preferred embodiments, materials are chosen both for their ability to withstand the high temperature and ultra high vacuum environment and to avoid contamination of the MBE environment. Crucible temperatures in the MBE environment are typically near 1100° C. and may reach 1700° C. for short periods.

With knowledge of the present disclosure, one skilled in the art will recognize that to obtain the desired near constant temperature along the long axis of the effusion cell crucible, a plurality of filament distributions may be employed utilizing a higher frequency pitch proximate the crucible opening relative to the pitch of the filament distribution in a more distal relationship to the crucible opening. The specific distribution and electrical connection of the plurality of pitches of the filament or filaments is readily determined using the guidelines discussed herein.

The preferred embodiments of the present invention are configurable for placement in commercial MBE systems. Thus, the present invention, through its achievement of a substantially constant temperature along the crucible long axis, largely avoids the formation of condensation near the open end of the crucible thus lowering the defect rate produced on substrates when compared to the Knudsen-type cell designs presently in use.

The present invention provides a method of producing a molecular beam of elemental molecules when a source material, including but not limited to aluminum and gallium, is placed in crucible 2, as described in the first preferred embodiment, and crucible 2 containing the source material and filament 6 supported by filament support disks 1 and surrounded by heat shield 4 are placed in a reduced pressure atmosphere and electric power is applied to filament 6, preferably by controllable electric power supply 28, producing a substantially constant temperature along the long axis of crucible 2.

In operation, the fourth preferred embodiment practices a method of producing a molecular beam of elemental molecules when a source material, including but not limited to aluminum and gallium, is placed in crucible 502. Crucible 502 and filament 500 surrounded by heat shield 504 are placed in a reduced pressure atmosphere and electric power is applied to filament 500 producing a substantially constant temperature along the long axis of crucible 502.

In operation, the apparatus of the second preferred embodiment also produces a molecular beam of elemental molecules when source materials are placed into crucible 102 or 202 and the crucible, filaments, and heat shield are placed in a reduced pressure atmosphere and electric power is applied to the filaments producing a substantially constant temperature along the long axis of the crucible. The power used to heat the filament is a function of the electrical resistivity of the filament and can be determined by applying Ohm's law. By way of illustration, when 11 feet of 0.020 inch diameter extended tantalum wire is used for the filament, approximately 75 volts of 60 hertz current at approximately 10 amps can heat the crucible to approximately 1700° C. Approximately 35 volts of direct current at approximately 7 amps will also heat the crucible to approximately 1700° C. When lower resistivity expanded tantalum is used, approximately 10 volts of direct current at approximately 10 amps can heat the crucible to approximately 1700° C.

In the second and third preferred embodiments, each heating filament may be selectively powered by a controllable electric power supply, such as power supply 128, to maintain a substantially constant temperature along the long axis of the crucible. In operation, the controllable electric power supply is preferably connected to a thermocouple, such as thermocouple assembly 108 as shown in FIG. 2, which supplies controllable electric power supply 128 with feedback information regarding the temperature of the crucible in the reduced pressure atmosphere. This feedback information assists controllable electric power supply 128 in determining when to power first filament 100 and second filament 106.

For example, based on the crucible shape, size and material, a user may wish to initially power both first filament 100 and second filament 106. After attaining a desired temperature, the user may wish to instruct controllable electric power supply 128 to only power first filament 100 and allow first filament 100 and heat shield 104 to maintain a substantially constant temperature along the crucible long axis without the need for powering second filament 106 at all times when first filament 100 is powered.

In operation, the substantially constant temperature produced along the crucible's long axis allows a flux of the source material to be generated while largely avoiding condensation and microdroplet formation. This serves to reduce defects which result from such problems.

What is claimed is:

1. An effusion cell comprising:
   a crucible having an open end and a closed end; and
   at least one heating filament distributed immediate said crucible, a first portion of said at least one heating filament having a first pitch in proximal relationship to said open end, and a second portion of said at least one heating filament having a second pitch different from said first pitch.

2. The effusion cell of claim 1 wherein said first pitch is a higher spatial frequency than said second pitch.

3. The effusion cell of claim 1 wherein said at least one heating filament is positioned in a non-inductively wound path about said crucible.

4. The effusion cell of claim 1 wherein said at least one heating filament is positioned in a serpentine path lengthwise about said crucible.

5. The effusion cell of claim 1 wherein said at least one heating filament is positioned in conformity to the outside structure of said crucible.

6. The effusion cell of claim 1 wherein said at least one heating filament comprises resistive material of a wire form.

7. The effusion cell of claim 1 wherein said at least one heating filament comprises resistive material of a foil form.

8. The effusion cell of claim 1 wherein said at least one heating filament comprises at least one material selected from the group consisting of tantalum, tungsten and rhenium.

9. The effusion cell of claim 1 wherein said at least one heating filament comprises at least one material selected from the group consisting of tantalum, tungsten, rhenium and alloys thereof.

10. The effusion cell of claim 1 further comprising heat shielding means positionable proximate and about said crucible and said at least one heating filament.

11. The effusion cell of claim 10 wherein said heat shielding means comprises multiple thermally isolated concentric foil wraps.

12. The effusion cell of claim 11 wherein said heat shielding means further comprises metal strips attached at one end of the outer diameter of said concentric foil wraps spacing each said wrap from each adjacent said wrap.

13. The effusion cell of claim 12 wherein said foil wraps comprise tantalum and said metal strips comprise expanded tantalum.

14. The effusion cell of claim 1 further comprising a temperature sensing assembly positioned in intimate proximity to said closed end of said crucible.

15. The effusion cell of claim 14 wherein said temperature sensing assembly comprises a dual thermocouple assembly.

16. The effusion cell of claim 1 further comprising a filament support disk positioned about said crucible.

17. The effusion cell of claim 16 wherein said filament support disk comprises passages, said at least one heating filament traversing said filament support disk through said passages.

18. The effusion cell of claim 16 wherein said filament support disk comprises tantalum.

19. The effusion cell of claim 10 further comprising crucible support means thermally isolated from said crucible and from said heating filament.

20. The effusion cell of claim 19 wherein said support means comprises:
a support base;
support rods attached perpendicular to said base;
a heat shield base attached to said support rods in parallel and spaced apart relationship to said support base;
a support cup attached to and thermally isolated from said heat shield base; and
said heat shielding means being attached to said support cup.

21. The effusion cell of claim 20 wherein said support rods being inert.

22. The effusion cell of claim 20 wherein said support rods comprise molybdenum.

23. The effusion cell of claim 20 wherein said heat shield base being inert and weldable to said heat shielding means.

24. The effusion cell of claim 20 wherein said heat shield base comprises tantalum.

25. The effusion cell of claim 1 further comprising at least one electric power supply for powering said at least one heating filament.

26. The effusion cell of claim 14 wherein said temperature sensing assembly is connected to at least one controllable electric power supply, said at least one power supply being connected to said at least one heating filament and said temperature sensing assembly controls electric power to said at least one heating filament based on temperature sensed.

27. The effusion cell of claim 1 wherein said crucible being substantially inert, substantially transparent to infrared energy and substantially able to withstand high thermal stresses.

28. The effusion cell of claim 1 wherein said crucible comprises at least one material selected from the group consisting of pyrolytic boron nitride and aluminum nitride.

29. The effusion cell of claim 1 wherein said at least one heating filament comprises a heating filament distributed immediate said crucible having a plurality of pitches wherein said plurality of pitches comprises a first pitch in proximal relationship to said open end, said first pitch having a higher frequency than all other pitches of said plurality of pitches.

30. The effusion cell of claim 29 wherein said heating filament is positioned in a non-inductively wound path about said crucible.

31. The effusion cell of claim 29 wherein said heating filament is positioned in conformity to the outside structure of said crucible.

32. The effusion cell of claim 31 further comprising heat shielding means positioned proximate and about said crucible and said heating filament.

33. The effusion cell of claim 32 further comprising a filament support positioned about said crucible.

34. The effusion cell of claim 33 wherein said filament support comprises passages and said heating filament traverses said filament support through said passages.

35. The effusion cell of claim 33 wherein said filament support being substantially inert, substantially transparent to infrared energy and substantially able to withstand high thermal stress.

36. The effusion cell of claim 33 wherein said filament support comprises at least one material selected from the group consisting of boron nitride and aluminum nitride.

37. The effusion cell of claim 32 further comprising support means thermally isolated from said crucible and from said heating filament.

38. The effusion cell of claim 29 further comprising a controllable electric power supply for powering said heating filament.

39. The effusion cell of claim 1 wherein said at least one heating filament comprises:
a first heating filament distributed immediate said crucible, in proximal relationship to said open end and having a first pitch;
a second heating filament distributed immediate said crucible, in distal relationship to said open end and having a second pitch, said first pitch having a higher spatial frequency than said second pitch.

40. The effusion cell of claim 39 wherein said first and second heating filaments are positioned in non-inductively wound paths about said crucible.

41. The effusion cell of claim 39 wherein said first and second heating filaments are positioned in conformity to the outside structure of said crucible.

42. The effusion cell of claim 39 further comprising heat shielding means positioned proximate and about said crucible and said first and second heating filaments.

43. The effusion cell of claim 42 further comprising a filament support disk positioned about said crucible.

44. The effusion cell of claim 43 wherein said filament support disk comprises a first set of passages and a second set of passages, said first heating filament traversing said filament support disk through said first set of passages, and said second heating filament traversing said filament support disk through said second set of passages.

45. The effusion cell of claim 42 further comprising support means thermally isolated from said crucible and from said first and second heating filaments.

46. The effusion cell of claim 39 further comprising a first electric power supply for powering said first heating filament, and a second electric power supply for powering said second heating filament.

47. An effusion cell comprising:
a crucible having an open end and a closed end; and
at least one heating filament distributed immediate said crucible to produce a substantially constant temperature along the long axis of said crucible.

48. A method of producing a molecular beam of source material comprising:
placing source material in a crucible, said crucible having an open end and a closed end;
distributing at least one heating filament immediate said crucible, a first portion of said at least one heating filament having a first pitch in proximal relationship to said open end, and a second portion of said at least one heating filament having a second pitch different from said first pitch;
placing said crucible and said at least one heating filament in a reduced pressure atmosphere; and
applying electrical power to said at least one heating filament producing a substantially constant temperature along the long axis of said crucible and generating a molecular beam of said source material.

49. The method of claim 48 wherein said step of distributing at least one heating filament comprises distributing said at least one heating filament having said first pitch at a higher spatial frequency than said second pitch.

50. The method of claim 48 further comprising the step of controlling a temperature of said crucible.

51. The method of claim 50 wherein said step of controlling said temperature comprises controlling electric power supplied to said at least one heating filament.

52. The method of claim 50 wherein said step of controlling said temperature comprises sensing a temperature in intimate proximity to the closed end of said crucible, and controlling electric power supplied to said at least one heating filament according to said sensed temperature.

53. The method of claim 48 further comprising the step of heat shielding said crucible and said at least one heating filament.

54. The method of claim 48, wherein said step of distributing at least one heating filament comprises positioning said at least one heating filament non-inductively about said crucible.

55. The method of claim 48 wherein said step of distributing at least one heating filament comprises distributing a heating filament immediate said crucible having a plurality of pitches wherein said plurality of pitches includes a first pitch in proximal relationship to said open end, said first pitch having a higher spatial frequency than all other pitches of said plurality of pitches.

56. The method of claim 55 further comprising the step of controlling a temperature of said crucible.

57. The method of claim 56 wherein said step of controlling said temperature comprises controlling electric power supplied to said heating filament.

58. The method of claim 56 wherein said step of controlling said temperature comprises sensing a temperature in intimate proximity to the closed end of said crucible and controlling electric power to said heating filament.

59. The method of claim 55 further comprising the step of heat shielding said crucible and said heating filament.

60. The method of claim 55, wherein said step of distributing said filament comprises positioning said heating filament non-inductively about said crucible.

61. The method of claim 48 wherein said step of distributing at least one heating filament comprises:
distributing a first heating filament immediate said crucible, in proximal relationship to said open end and having a first pitch;
distributing a second heating filament immediate said crucible, in distal relationship to said open end and having a second pitch, said first pitch having a higher spatial frequency than said second pitch.

62. The method of claim 61 further comprising the step of controlling the temperature of said crucible.

63. The method of claim 62 wherein said step of controlling said temperature comprises controlling electric power supplied to said first and second heating filaments.

64. The method of claim 62 wherein said step of controlling said temperature comprises sensing a temperature in intimate proximity to the closed end of said crucible and controlling electric power to said first and second heating filaments.

65. The method of claim 61 further comprising the step of heat shielding said crucible and said first and second heating filaments.

66. The method of claim 61 wherein said steps of distributing said first and second heating filaments comprise positioning said first and second heating filaments noninductively about said crucible.

* * * * *

UNITED STATES PATENT AND TRADEMARK OFFICE
CERTIFICATE OF CORRECTION

PATENT NO. : 5,034,604

DATED : July 23, 1991

INVENTOR(S) : Streetman et al

It is certified that error appears in the above-identified patent and that said Letters Patent is hereby corrected as shown below:

On the title page, in field [75] Inventors, at lines 4-5 thereof, delete "; Ben G. treetman, Austin; Terry Mattord, Red Rock, both of Tex.".

Signed and Sealed this

Eighth Day of December, 1992

Attest:

DOUGLAS B. COMER

Attesting Officer

Acting Commissioner of Patents and Trademarks